United States Patent [19]

Goto et al.

[11] Patent Number: 5,093,618
[45] Date of Patent: Mar. 3, 1992

[54] MULTI-CHANNEL SQUID FLUXMETER WITH TIME DIVISION FEEDBACK

[75] Inventors: Takao Goto, Kawasaki; Yutaka Igarashi, Yokohama; Takehiko Hayashi, Kawasaki, all of Japan

[73] Assignee: Fujitsu Limited, Kawasaki, Japan

[21] Appl. No.: 550,171

[22] Filed: Jul. 9, 1990

[30] Foreign Application Priority Data

Jul. 10, 1989 [JP] Japan ............................ 1-178851

[51] Int. Cl.⁵ ............................................. G01R 33/035
[52] U.S. Cl. .................................... 324/248; 505/846
[58] Field of Search ........................ 324/248; 307/306; 327/5; 505/843, 845, 846, 702

[56] References Cited

U.S. PATENT DOCUMENTS 4,591,787  5/1986  Hoenig ............................. 324/248
4,613,817  9/1986  Hoenig ............................. 324/248
4,771,239  9/1988  Hoenig ............................. 324/248

Primary Examiner—Kenneth A. Wieder
Assistant Examiner—Warren S. Edmonds
Attorney, Agent, or Firm—Staas & Halsey

[57] ABSTRACT

In a multi-channel SQUID fluxmeter for detecting magnetic flux signals by use of an array of SQUID flux sensors each comprising a digital SQUID for providing a pulse output, multiplexers and the like are appropriately used to allow pulse signals output from the SQUID flux sensors to be switched on a time series basis in order to obtain a magnetic flux signal for each channel. Thus, only one processing circuit need to be provided for a large number of SQUID flux sensors, thus reducing the scale of the fluxmeter and making the device small.

17 Claims, 9 Drawing Sheets

MULTI-CHANNEL SQUID FLUXMETER WITH TIME DIVISION FEEDBACK

BACKGROUND OF THE INVENTION

1. Field of the Invention

The present invention relates to a multi-channel SQUID (superconducting quantum interferometer device) fluxmeter for detecting magnetic flux signals on the basis of pulse signals from a plurality of SQUID flux sensors.

2. Description of the Related Art

High-sensitivity fluxmeter using superconducting quantum interferometer devices (SQUIDs) are employed for measuring small magnetic fields generated by an object under examination, such as a living body. By measuring the distribution of magnetic fields in the brain or the heart, for example, it is possible to estimate the currents which generate them. It is pointed out, from the diagnostic point of view, that the estimation of currents provides very meaningful information and is useful for clarifying the neural activity within a living body. Magnetic fields may be measured with a one-channel SQUID fluxmeter which is adapted to sequentially measure time series data from each part. However, this method takes a long time and the person under examination gets tired. In addition, since the simultaneous measurement of magnetic fields cannot be made in different parts, the currents cannot be estimated with great accuracy. A multi-channel SQUID fluxmeter is thus required, which permits simultaneous measurement of magnetic fields from different portions of the organ under examination.

In a conventional multi-channel SQUID fluxmeter, a processing circuit for converting a detected signal to a flux signal is provided for each one-channel flux sensor. Thus, if, for example, a 100-channel SQUID fluxmeter is to be realized, 100 processing circuits are needed. In analog SQUIDs, a method has also been proposed for simplifying the SQUID system by driving each of the SQUIDs with a different frequency and multiplexing the output lines of the SQUIDs to be sent over a single output line (Furukawa et al., Japanese Journal of Applied Physics, vol. 28, No. 3, Mar. 989, pp L456-L458). This method, however, requires as many phase detector circuits for demodulation as there are channels. Therefore, problems with the conventional device are its increased circuit scale and its increased power consumption.

Some digital SQUIDs are adapted to provide pulse outputs. One type consists of a two-junction quantum interferometer device and is A.C. biased to output a pulse output (refer to Japanese Unexamined Patent Publication No. 63-290979). Another is a D.C. SQUID which applies a voltage to a superconducting comparator or a 1-bit A/D converter to thereby provide a pulse output (D. Drung, Cryogenics, vol. 26, pp 623 –627, 1986).

SUMMARY OF THE INVENTION

An object of the present invention is to provide a multi-channel SQUID fluxmeter which enables measurement of pulse signals from an array of a plurality of digital SQUID flux sensors by use of at least one processing circuit and to thereby measure small magnetic fields from different portions of an object under examination at substantially the same time, said a fluxmeter having a reduced circuit scale.

A feature of the invention resides in a multi-channel SQUID fluxmeter for detecting magnetic flux signals by use of an array of a plurality of SQUID flux sensors comprising a plurality of SQUID flux sensors for detecting small magnetic fields from different portions of an object under examination, each of the SQUID flux sensors having a digital SQUID for providing pulse outputs and a processing circuit means for switching pulse output signals of the SQUID flux sensors to extract each of the pulse output signals on a time series basis and applying feedback signals to respective corresponding SQUID flux sensors so that each of the pulse output signals may become a predetermined value, whereby the intensity of magnetic flux is measured by said processing circuit means in terms of the magnitude of each of the feedback signals applied to respective corresponding SQUID flux sensors.

Another feature of the invention resides in a multi-channel SQUID fluxmeter for detecting magnetic flux signals by use of an array of a plurality of SQUID flux sensors comprising a plurality of SQUID flux sensors for detecting small magnetic fields from different portions of an object under examination, each of the SQUID flux sensors having a digital SQUID for providing pulse outputs and the SQUID flux sensors being divided into a plurality of groups and a plurality of processing circuit means corresponding in number to the groups for switching pulse output signals of the SQUID flux sensors to extract each of the pulse output signals on a time series basis and applying feedback signals to respective corresponding SQUID flux sensors so that each of the pulse output signals may reach a predetermined value, whereby the intensity of magnetic flux is measured by each of the processing circuit means in terms of the magnitude of each of the feedback signals applied to respective corresponding SQUID flux sensors.

Further feature of the invention resides in a multi-channel SQUID fluxmeter for detecting magnetic flux signals by use of an array of a plurality of SQUID flux sensors comprising a plurality of SQUID flux sensors for detecting small magnetic fields from different portions of an object under examination, each of the SQUID flux sensors having a digital SQUID for providing pulse outputs and a counter for switching pulse output signals of the SQUID flux sensors to extract each of the pulse output signals on a time series basis and counting the extracted pulse output signals and superconducting feedback circuit means provided for each of the SQUID flux sensors for storing magnetic flux quanta corresponding to the number of pulse output signals output from a corresponding SQUID flux sensor and applying a feedback signal corresponding to the magnetic flux quanta to the corresponding SQUID flux sensor so that the pulse output signals from the corresponding SQUID flux sensor may become a predetermined value, whereby the intensity of magnetic flux is measured in terms of a count value of the counter.

DETAILED DESCRIPTION OF THE PREFERRED EMBODIMENTS

Figure 1:
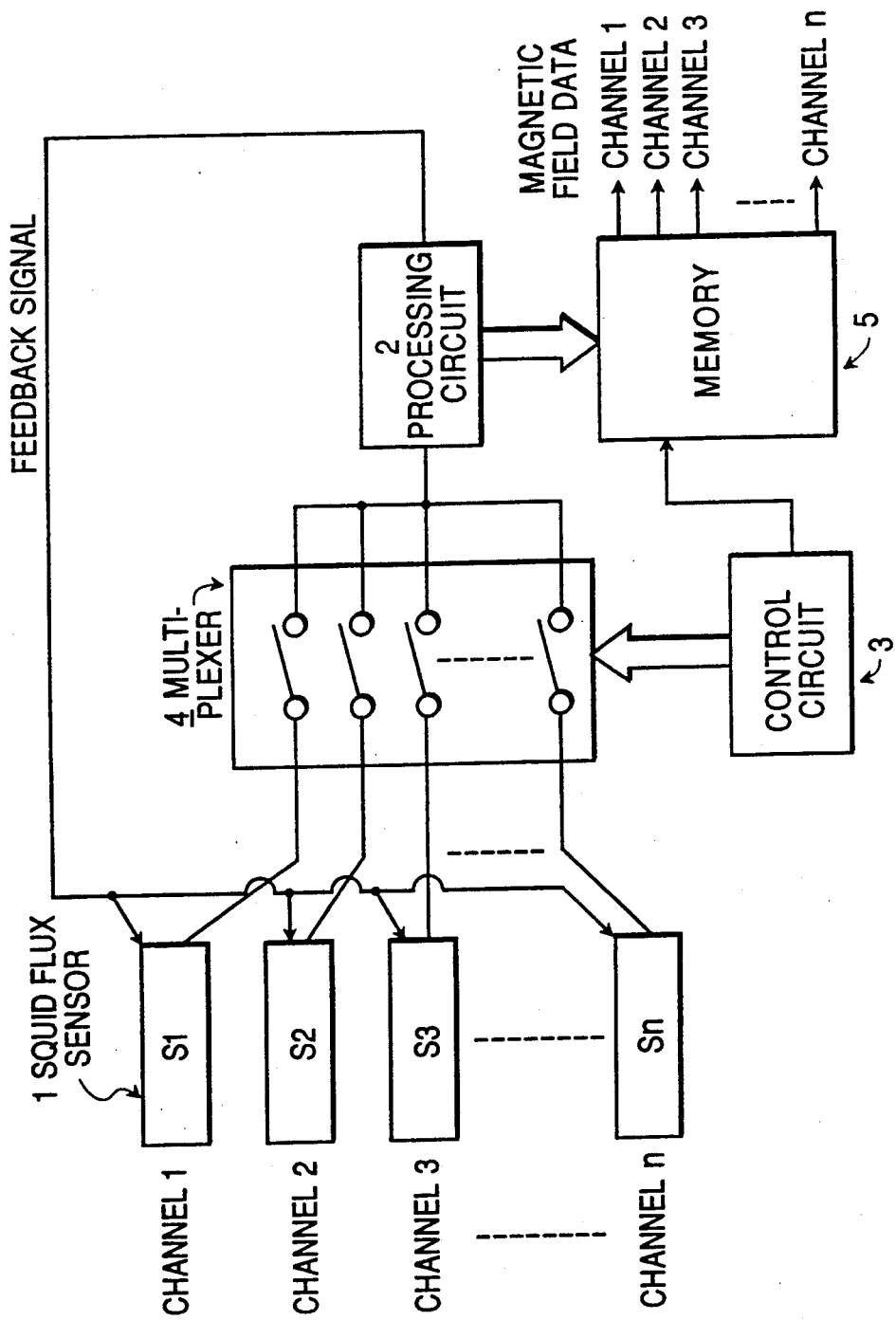
FIG. 1 illustrates the principle arrangement of the present invention.

FIG. 1 illustrates the principle structure of the present invention.

In FIG. 1, SQUID flux sensors 1 (S1 to Sn), each provided for a respective one of channels 1 to n, detect small magnetic fluxer from different portions of an object under examination, such as a living body, and are of a digital type which provide pulse outputs.

A processing circuit 2 is adapted to switch pulse signals output from SQUID flux sensors to take them out on a time series basis and to apply a feedback signal to a corresponding respective SQUID flux sensor 1 so that the pulse signals may have a predetermined magnitude.

Switching the pulse signals output from SQUID flux sensors 1 to take out them on a time series basis as described above may be made in a time divisional manner by means of a multiplexer 4 controlled by a control circuit 3, which sequentially takes out the pulse signals output from a plurality of SQUID, as illustrated in FIG. 1. Alternatively, though not shown, bias currents applied to the respective digital SQUIDs in plurality of SQUID flux sensors 1 may be switched on a time series basis by a multiplexer. This switching refers to sequentially taking out the pulse signals associated with S.1 (channel 1) to S.n (channel n) of SQUID flux sensors 1 for application to processing circuit 2 as illustrated in (1) of FIG. 2. The process of switching the pulse signals on a time series basis may also be repeated in plural cycles (t1, t2, ...) and a signal representing the intensity of magnetic flux may be obtained from processing circuit 2 at each repetition.

A memory 5 may be provided which stores a flux-intensity representing a signal (feedback signal) obtained by processing circuit 2 for each of channels 1 to n. Where such a memory 5 is provided, it is also possible, as illustrated in (2) to (5) of FIG. 2, to store a flux-intensity representing signal in each of its storage areas corresponding to a respective individual channel in each of cycles t1, t2, in a sequential switching operation.

Single processing circuit 2 need not to be one in number, but may be plural processing circuits (fewer in number than the channels). In this case, plural SQUID flux sensors 1 may be divided into a plurality of groups, the number of which is equal to that of the processing circuits, so that pulse signals output from SQUID flux sensors in each group are multiplexed for application to respective individual processing circuits.

Figure 2:
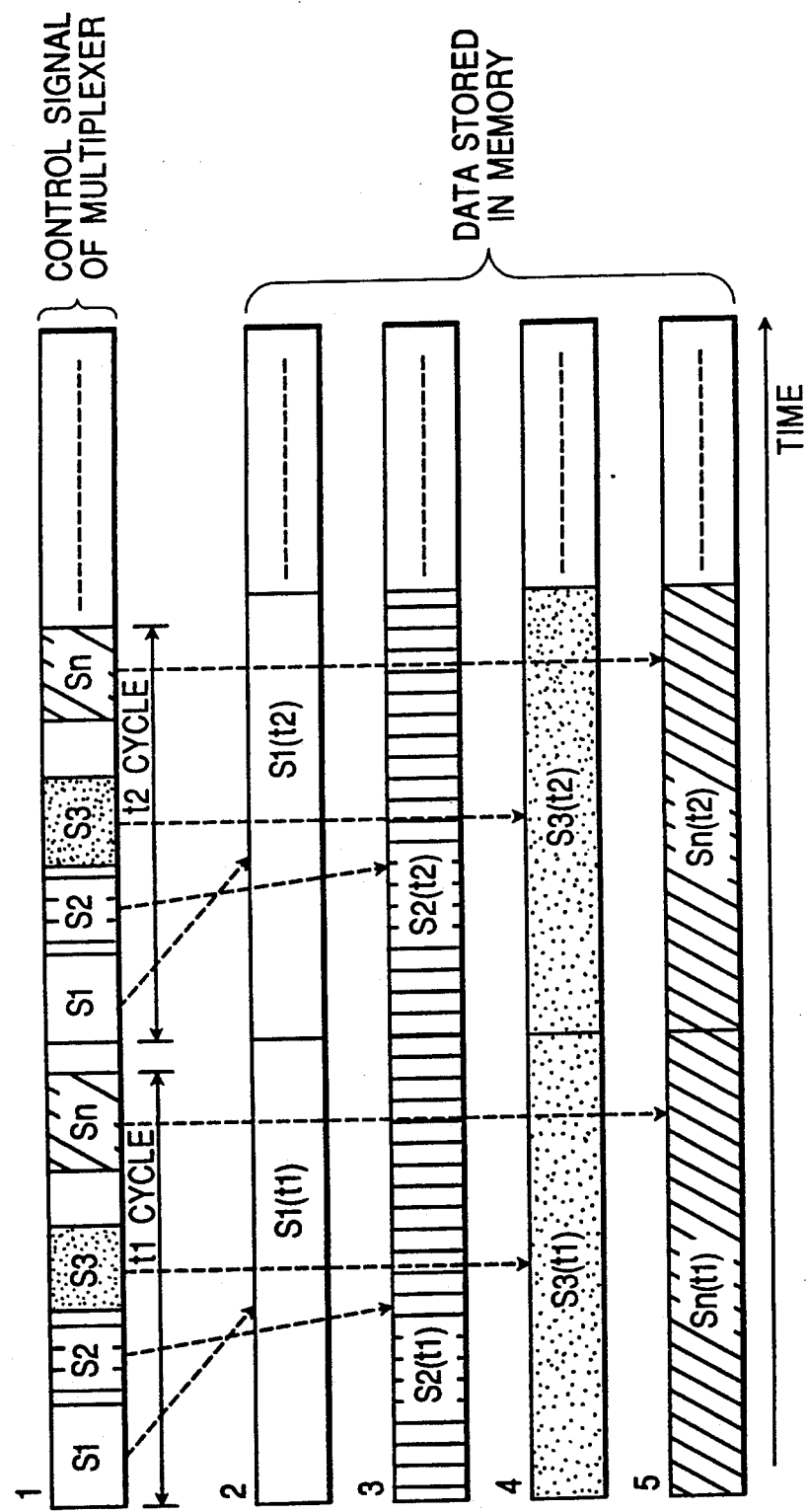
FIG. 2 illustrates the principle operation of the present invention.

In the present invention, as illustrated in FIGS. 1 and 2, processing circuit 2, which switches pulse signals output from SQUID flux sensors 1 on a time series basis and takes each of them in, applies a feedback signal to respective corresponding SQUID flux sensors 1 so that the pulse signals have predetermined magnitudes (for example, zero) and measures the intensity of corresponding magnetic fields in terms of the magnitudes of feedback signals.

Therefore, to measure field intensity, one or several processing circuits 2 have only to be provided for a large number of SQUID flux sensors 1, thereby enabling simultaneous measurement of small magnetic fields in a living body and reducing the scale of the fluxmeter circuit, thus making the device small.

Figure 3:
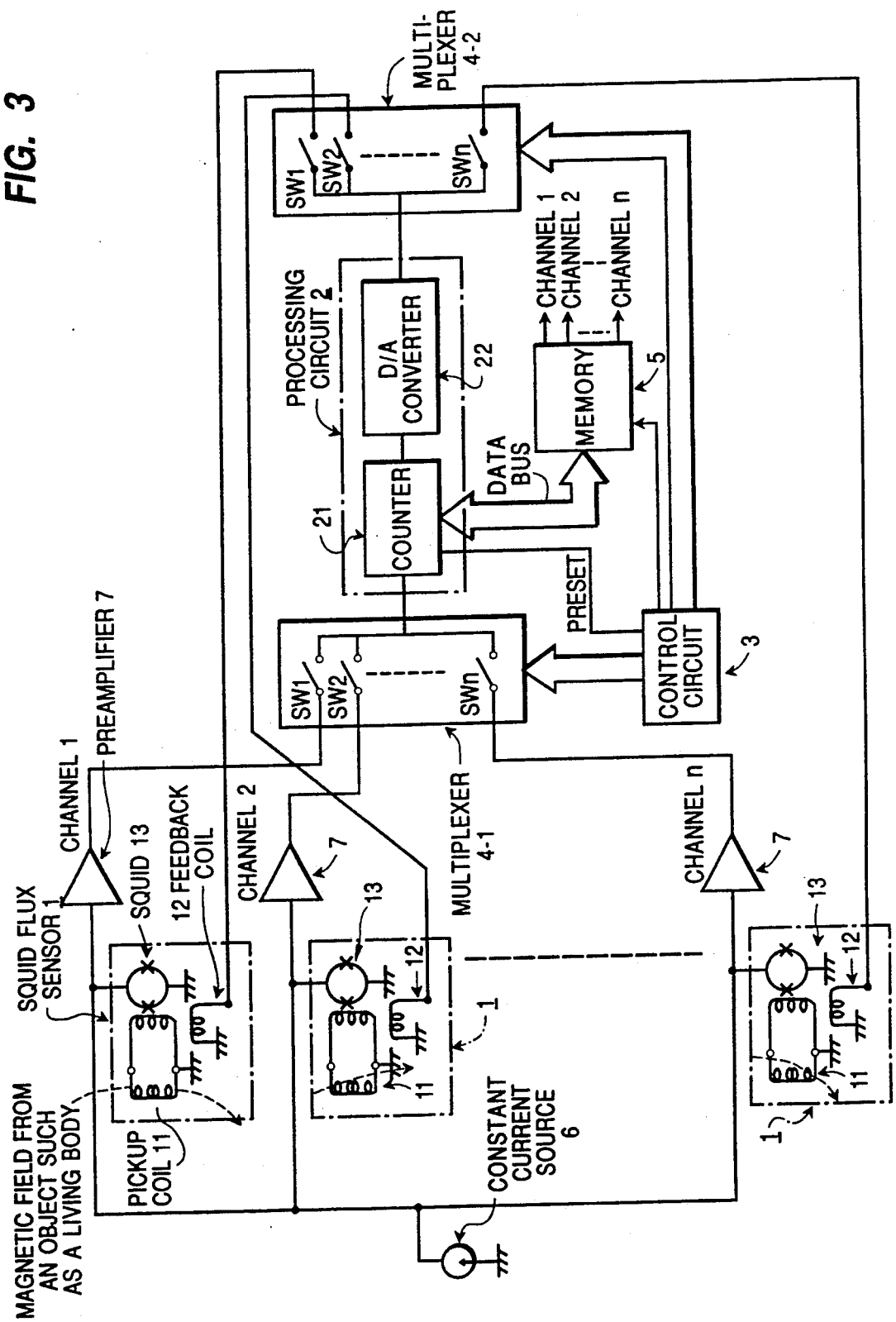
FIG. 3 illustrates an arrangement of a first embodiment of the present invention.

FIG. 3 illustrates a first embodiment of the present invention. In FIG. 3, n SQUID flux sensors 1, each employing a digital SQUID (superconducting quantum interferometer device) adapted to provide pulse outputs, are provided for channels 1 to n. More specifically, each of SQUID flux sensors 1 includes a pickup coil 11 for detecting a magnetic field in an object under examination such as a living body, a feedback coil 12 responsive to a feedback signal from processing circuit 2 to generate a magnetic field and a digital SQUID 13 formed of a Josephson junction.

SQUID flux sensors 1 are arrayed in a matrix over or near the object so as to simultaneously detect magnetic flux radiated from different portions of the object such as the heart. In SQUID flux sensors 1 configured as above, digital SQUIDs 13 are always supplied with an A.C. bias current from a constant current source 6. When, in this state, magnetic flux radiated from the object is applied to digital SQUID 13 through pickup coil 11, a pulse signal of a polarity (positive or negative) corresponding to the direction (positive or negative) of the magnetic flux is output in a cycle corresponding to that of the A.C. bias current. The magnetic flux can be detected in accordance with the presence or absence of the pulse signals (refer to Japanese Unexamined Patent Publication No. 63-290979).

Each of preamplifiers 7 is connected to its respective individual SQUID flux sensor 1 to amplify positive or negative pulse signals output from digital SQUID 13.

A multiplexer 4-1 sequentially selects a pulse signal from positive and negative pulse signals obtained from preamplifiers 7 for respective channels and applies the pulse signal to processing circuit 2.

Processing circuit 2 counts the pulse signals from multiplexer 4-1 and applies a feedback signal to each of SQUID flux sensors 1 so that pulse signals from it may become, for example, zero. The intensity of magnetic flux is measured in terms of the magnitude of the feedback signal. Specifically, processing circuit 2 is comprised of a counter 21 and a D/A converter 22.

Counter 21 is an up-down counter which, for example, counts up when a pulse signal from multiplexer 4-1 is positive and counts down when the pulse signal is negative.

D/A converter 22 converts a digital value (for example, a value corresponding to a difference in number between positive pulses and negative pulses obtained within a predetermined length of time) obtained by counter 21 to an analog value.

A multiplexer 4-2 operates synchronously with multiplexer 4-1 to apply an analog value from D/A converter 22 to feedback coil 12 of a corresponding one of SQUID flux sensors 1. Feedback coil 12 is adapted to generate magnetic flux of a magnitude corresponding to that of an analog feedback signal output from D/A converter 22. This magnetic flux is applied to digital SQUID 13 in a direction to cancel out externally applied magnetic flux. Feedback control is theresby carried out so that the number of pulses input to counter 21 become zero.

Memory 5 stores a signal representing the intensity of magnetic flux measured by processing circuit 2, i.e., a count value of counter 21, for each of channels 1 to n.

Control circuit 3 is adapted to apply switching signals to multiplexers 4-1 and 4-2, control addressing of memory 5 in storing counts of counter 21 and presets a predetermined value (a value stored in memory 5 in the previous cycle) in counter 21.

Figure 4:
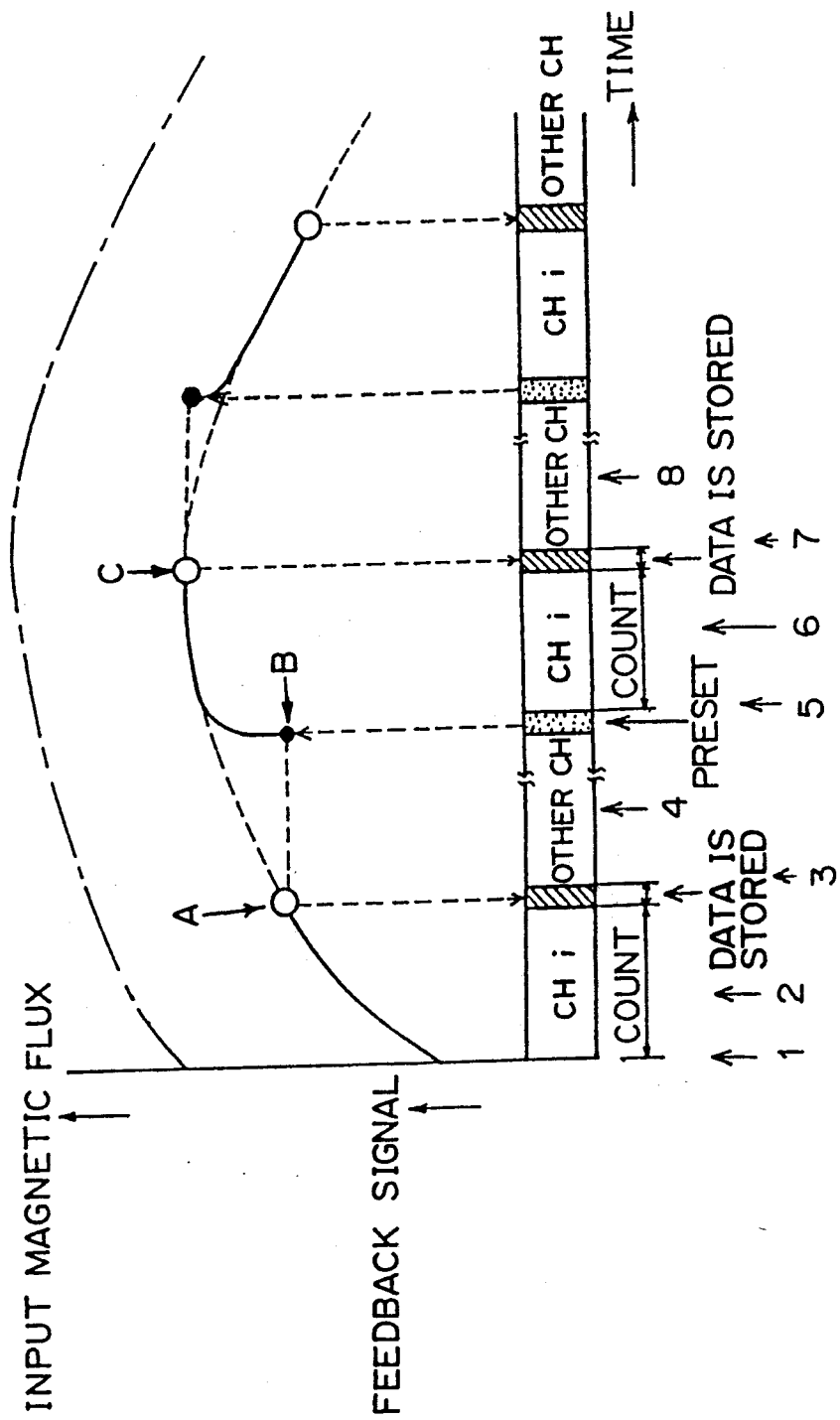
FIG. 4 is a diagram for use in explaining the operation of the first embodiment of the present invention.

Next, the operation of the present embodiment will be described with reference to FIGS. 2 and 4.

First, the basic operation of the present embodiment, or the process of switching pulse signals by means of multiplexer 4-1 and the process of storing counter values of counter 21 in memory 5 will be described below with reference to FIG. 2.

As depicted in (1) of FIG. 2, pulse signals from S.1 (channel 1) to S.n (channel n) of SQUID flux sensors 1 are sequentially switched by multiplexer 4-1 to be entered into processing circuit 21 and the entered pulse signals are counted by counter 21. This switching process is repeated for a plurality of cycles (t1. t2, ... ).

As illustrated in (2) to (5) of FIG. 2, on the other hand, the count in counter 21 for each of the channels is stored in its corresponding respective storage area of memory 5 as magnetic flux data (a signal representing the intensity of magnetic flux) in each of cycles t1, t2, . . . That is, the storage area in memory 5 which corresponds to channel 1 stores flux signals S.1(t1), S.2(t2) . . . from S.1 of SQUID flux sensors 1 in corresponding respective cycles t1, t2, . . . , as shown in (2) of FIG. 2. The storage area in memory 5 which corresponds to channel 2 stores flux signals S.2(t1), S.2(t2), . . . from S.2 of SQUID flux sensors 1 in corresponding respective cycles t1, t2, memory 5 which corresponds to channel 3 stores flux signals S.3(t1), S.3(t2), . . . from S.3 of SQUID flux sensors 1 in corresponding respective cycles t1, t2, . . . as shown in (4) of FIG. 2. Likewise, the storage area in memory 5 which corresponds to channel n stores flux signals S.n(t1), S.n(t2), . . . from S.n of SQUID flux sensors 1 in corresponding respective cycles t1, t2, . . . as shown in (5) of FIG. 2.

Subsequently, the more specific operation associated with a channel i (i=1−n) will be described below with reference to FIG. 4. In this Figure, the abscissa represents time, while the ordinate represents the magnitude of feedback signal and the intensity of input magnetic flux.

First, at time (1), a feedback loop for channel 1 extending from SQUID flux sensor 1 through preamplifier 7, multiplexer 4-1, counter 21, D/A converter 22 and multiplexer 4-2 to feedback coil 12 is closed to initiate feedback control. This feedback control is performed only for a predetermined time period indicated at (2), during which time counter 21 counts up with positive pulses from SQUID flux sensor 1 and counts down with negative pulses.

After the predetermined time period indicated by (2) has elapsed, at time (3) ((A)), the counter value of counter 21 is stored as magnetic flux data in the storage area of memory 5 corresponding to channel i.

Subsequently, during the time period indicated by (4), the counting process and data storing process are also performed for other channels as in the case of channel i.

After the measurement of magnetic flux for all of channels 1 to n has been terminated in that way, the flux is measured again for channel i during the next cycle. In this case, at time indicated at (5) ((B)), the flux signal data (the count of counter 21) which has been stored in memory 5 in the previous cycle is read from memory 5 and then preset in counter 21. At the same time, the feedback loop for channel i is closed so that counter 21 initiates its counting operation, as was performed at time (1). After the counting operation is performed, a predetermined time period indicated by (6), at time (7) ((C)), the count value of counter 21 is stored as magnetic flux data in the corresponding storage area to channel i in memory 5.

The above operation of presetting counter 21 and storing data is repeated for each of channels 1 to n to measure the intensity of magnetic flux for each of channels 1 to n every cycle. Thus, the magnetic flux signal data corresponding to the intensity of input magnetic flux can be obtained for each channels and every cycle.

Figure 5:
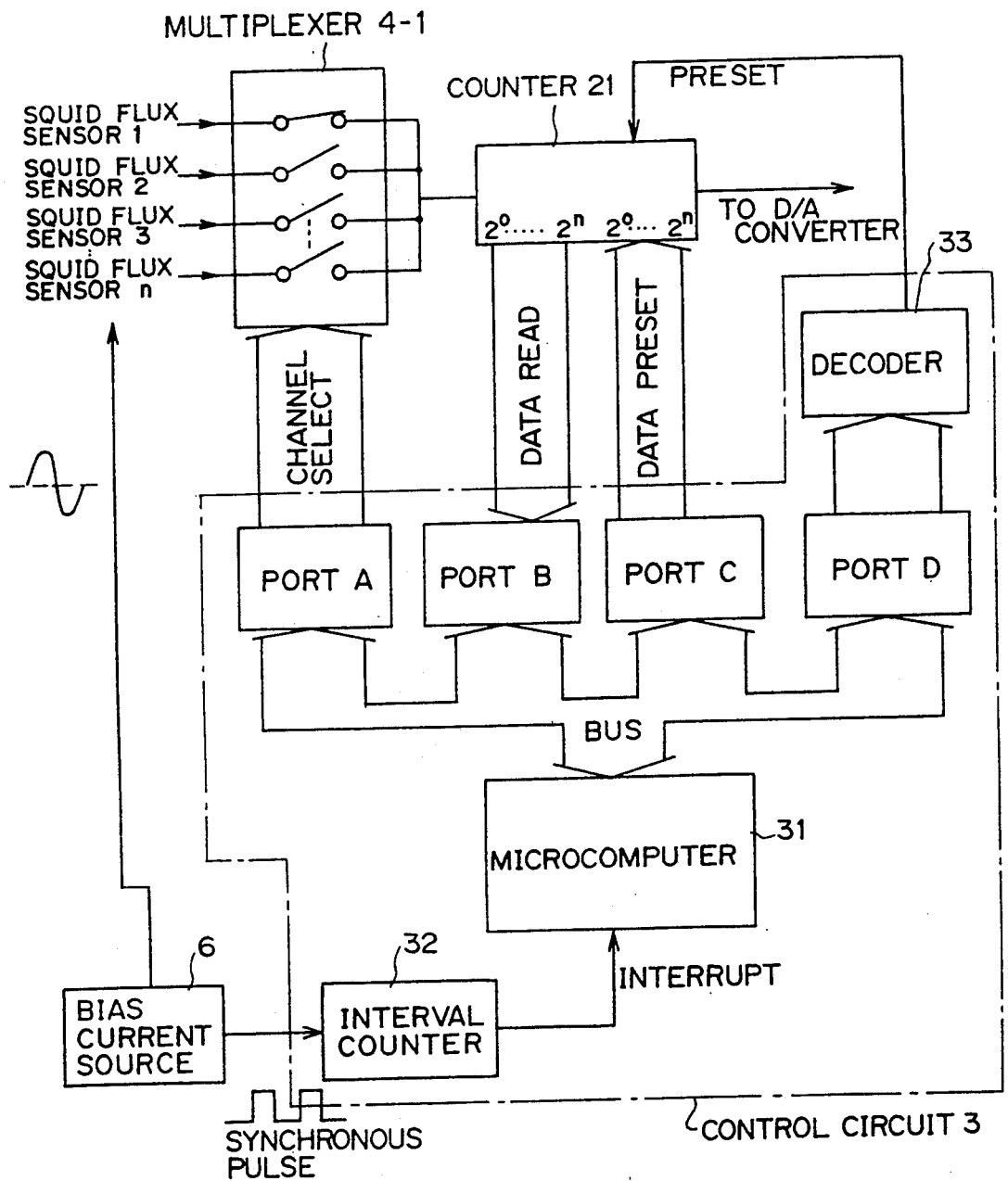
FIG. 5 illustrates a specific arrangement of the control circuit of FIG. 3.
Figure 6:
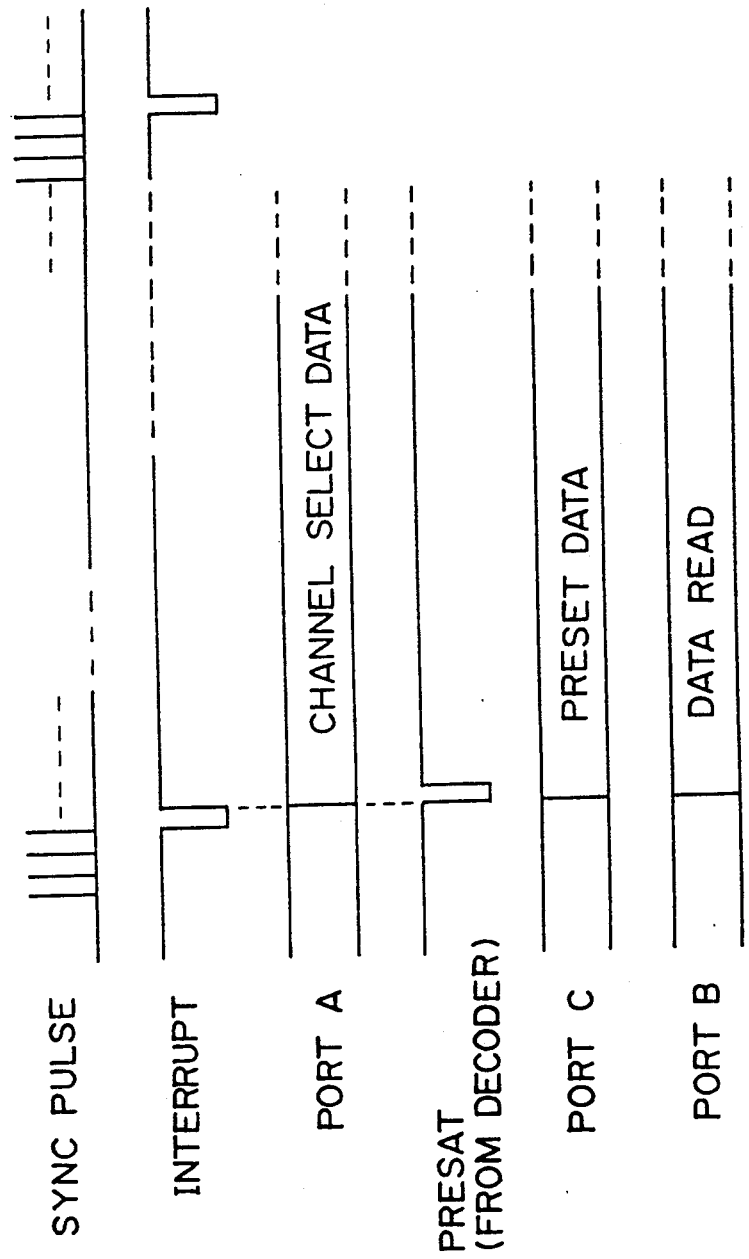
FIG. 6 is a timing chart illustrating the principal operation of the control circuit of FIG. 3.

A specific configuration of control circuit 3 for realizing the above operation and a timing chart associated with its principal operation are illustrated in FIGS. 5 and 6, respectively.

Basically, the control by control circuit 3 can be entirely executed by a microcomputer 31 as shown in FIG. 5. Microcomputer 31 includes a memory 5. In this configuration, microcomputer 31 is subjected to forced hardware interruption by an interval counter 32 every time a channel is selected. When microcomputer 31 is interrupted, a program begins to run so that, in the beginning, channel select data is output onto a port A and multiplexer 4-1 selects a channel in response to the data. A multiplexer adapted for channel selection usually includes a decoder. To turn eight switches on or off one at a time, therefore, only $\log_2 8 = 3$ signal lines have to be provided. Next, a preset command is output onto a port D and preset data (namely, the count of one cycle before) is output onto a port C so that counter 21 is preset with the data. Thereafter, the count of counter 21 at a desired point of time is entered into microcomputer 31 via port B to be stored in its memory (corresponding to memory 5). When microcomputer 31 is subsequently interrupted, the next channel is selected for the same processing.

According to the present embodiment, as described above, only one processing circuit 2 can sequentially receive signals from SQUID flux sensors 1 of a large number of channels to measure the intensity of magnetic flux for each channel. Therefore, small magnetic fields from the object can be measured in the channels at substantially the same time and one processing circuit 2 suffices for a large number of SQUID flux sensors 1, thereby reducing the circuit scale and enabling the device to be made small.

Moreover, in the present embodiment, counter 21 is preset with the count obtained in the previous cycle for each channel and initiates its counting operation using the preset value as an initial value. That is, as illustrated in FIG. 4, a count initial value (a count at the point of time indicated by (B) in FIG. 4) of counter 21 becomes equal to the count (the count at the point of time indicated by (A) in FIG. 4) obtained in the previous cycle for the same channel. Thus, a difference between the actual intensity of magnetic flux at the point of time when counter 21 starts its counting operation and the intensity of magnetic flux corresponding to a count initial value can be made very small. Therefore, as seen from the transit from (B) to (C) in FIG. 4, the count after counter 21 starts its count operation, or the magnitude of a feedback signal can be made to rapidly follow a value corresponding to the actual intensity of magnetic flux.

Figure 7:
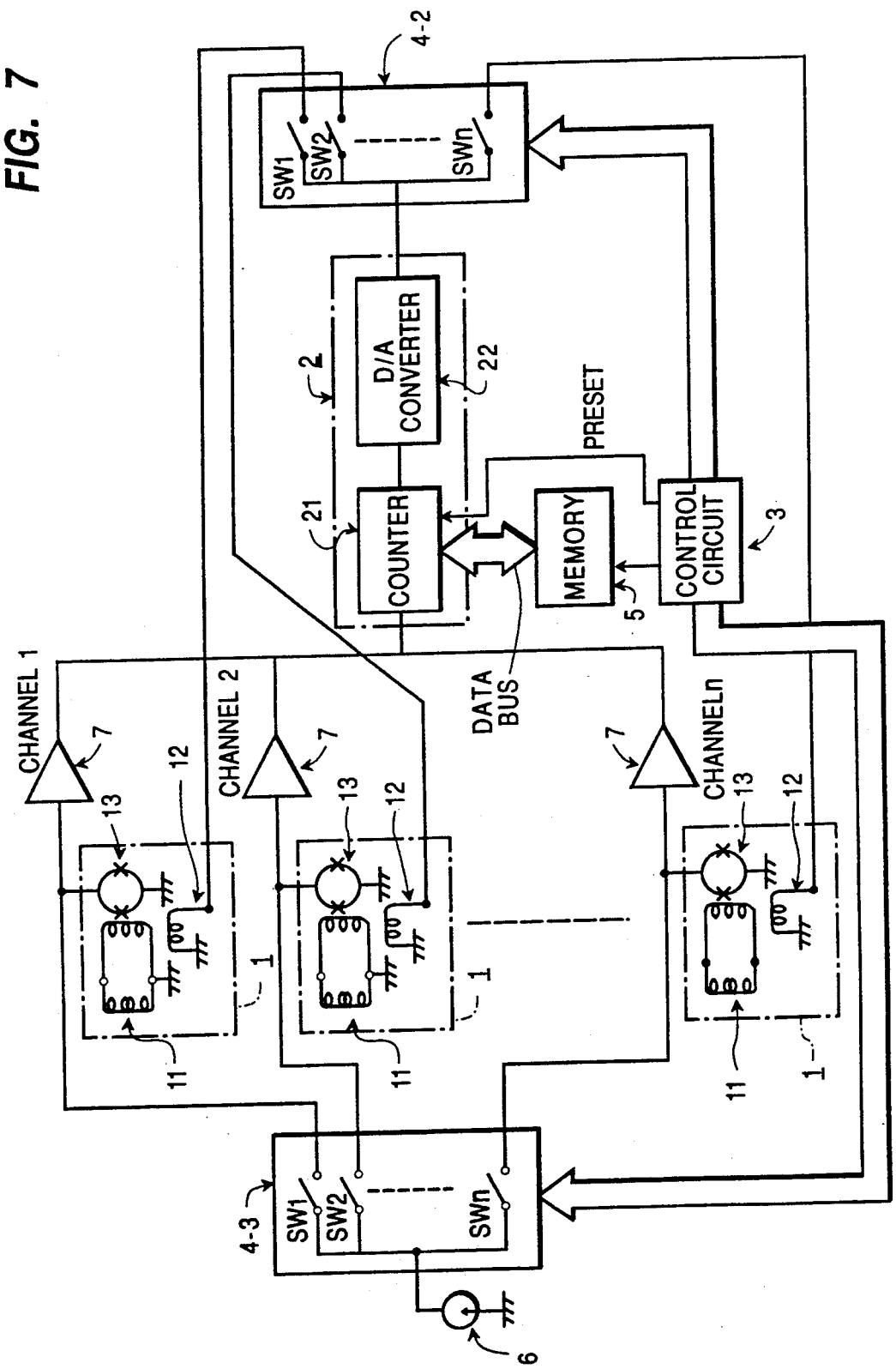
FIG. 7 illustrates an arrangement of a second embodiment of the present invention.

FIG. 7 illustrates a second embodiment of the present invention. This embodiment is arranged such that a multiplexer 4-3 is connected between current source 6 and SQUID flux sensors 1 to sequentially supply an A.C. bias current to SQUIDs 13 in one of the SQUID flux sensors 1 and sequentially generated pulse signals are entered into counter 21. The switching timing of multiplexer 4-3 may be the same as that of multiplexer 4-1 of FIG. 3 in the first embodiment described above. In other respects, the second embodiment is the same as the first embodiment so the description thereof is unnecessary.

In the present embodiment as well, the intensity of magnetic flux is measured for each channel on a time series basis, and the count obtained in the previous cycle is preset into counter 21 for each channels, thus providing the same advantages as the first embodiment.

Figure 8:
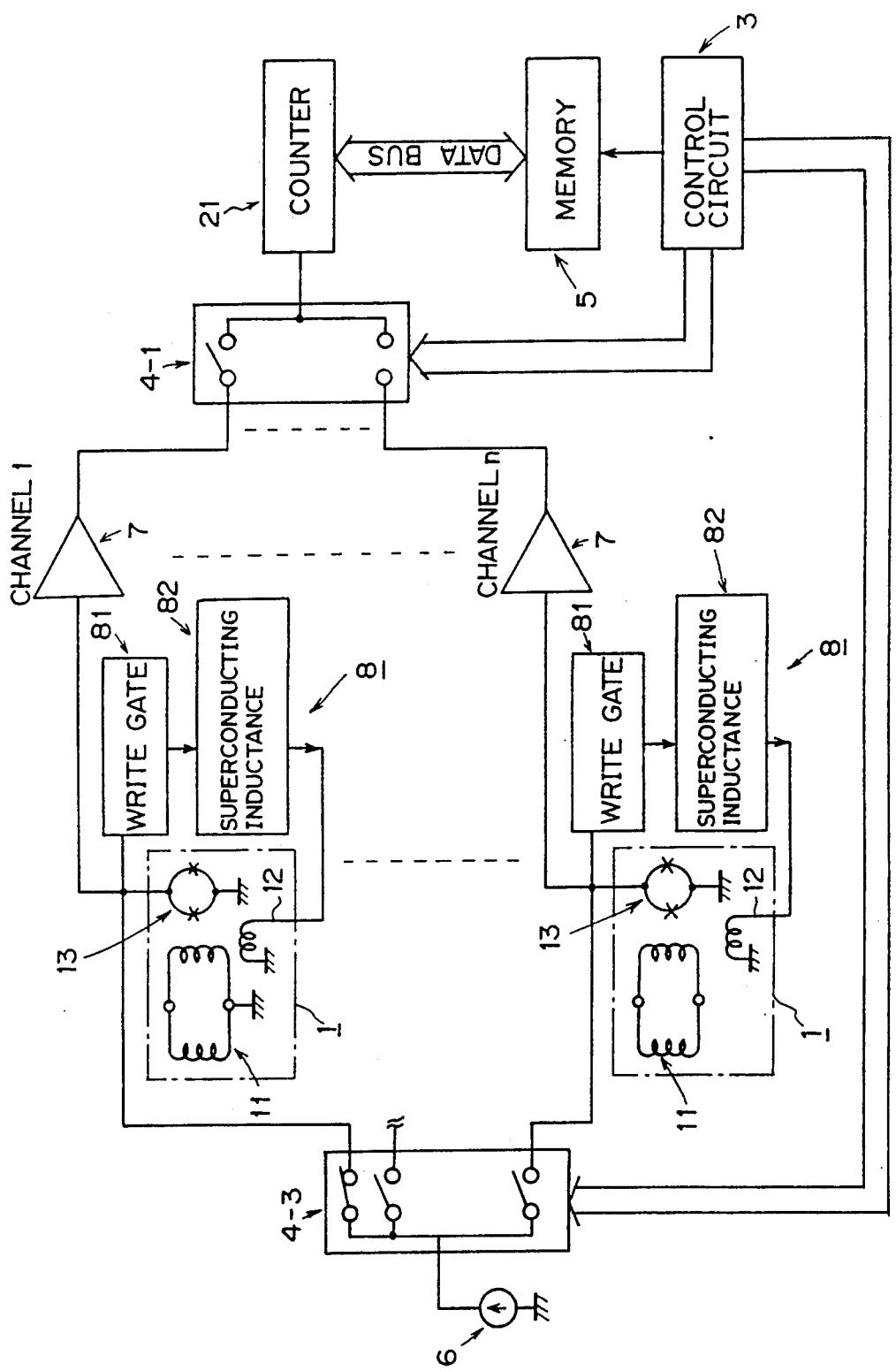
FIG. 8 illustrates an arrangement of a third embodiment of the present invention.
Figure 9:
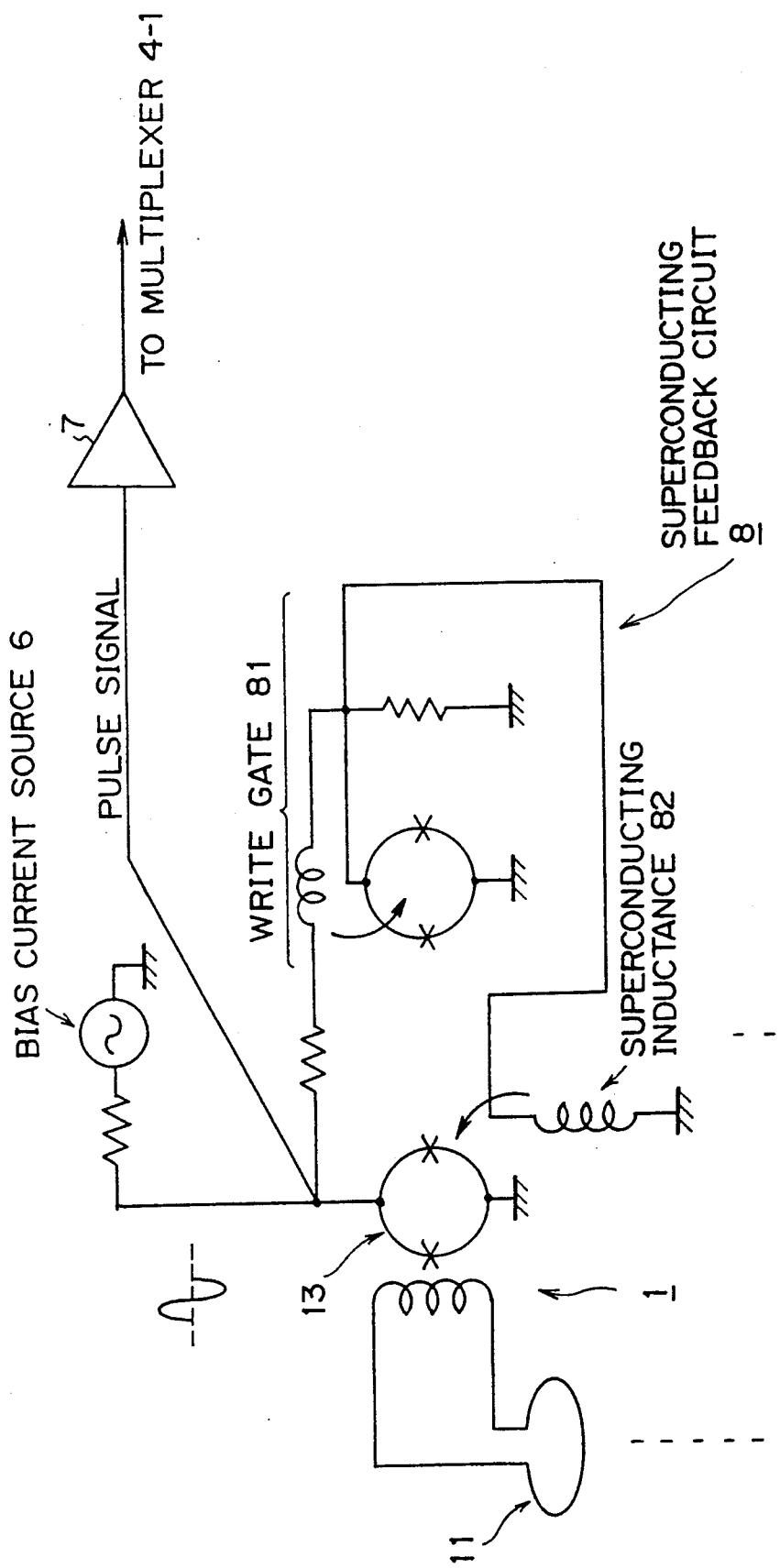
FIG. 9 illustrates a specific arrangement of the principal portion of the third embodiment.

Next, FIG. 8 illustrates a third embodiment of the present invention, and FIG. 9 illustrates a specific arrangement of the principal portion of the third embodiment.

As illustrated in FIG. 8, the third embodiment is the same as the second embodiment shown in FIG. 7 in that any one of SQUID flux sensors 1 may be selected by multiplexer 4-3, but is mainly distinct from the second embodiment in that a superconducting feedback circuit 8 comprised of a write gate 81 and a superconducting inductance 82 is provided for each channel instead of the feedback circuits in FIG. 7. As illustrated specifically in FIG. 9, such a superconducting feedback circuit 8 stores magnetic flux quanta corresponding to the number of pulse signals output from digital SQUID 13 of SQUID flux sensor 1 in superconducting inductance 82 by use of write gate 81 and thereby applies magnetic flux to digital SQUID 13 so that the number of pulse signals becomes a predetermined number (for example, zero). The circuit provides the same function as the feedback circuit comprised of counter 21 and D/A converter 22 shown in FIGS. 3 and 7. This type of superconducting feedback circuit is described in detail, for example, in "A Single-Chip SQUID Magnetometer", N. Fujimaki et al., IEEE Trans. Electron Device, vol. 35, no. 12 pp 2412–2418, 1988 and Japanese Patent Publication No. 63-290979.

With superconducting feedback circuit 8, a digital quantity of feedback cannot be obtained and thus it cannot be stored in memory 5 as it is with an intensity of magnetic flux. For this reason, the present embodiment is arranged to amplify pulse signals from SQUID flux sensors 1 which are subjected to feedback by superconducting feedback circuits 8 by preamplifiers 7 and then count the number of pulses only on a channel selected by multiplexer 4-1 synchronized with multiplexer 4-3 with counter 21 so as to store its count in memory 5.

The third embodiment requires as many superconducting feedback circuits 8 as there are channels. As compared with counter 21 and D/A converter 22, however, write gate 81 and superconducting inductance 82 can be configured on a reduced scale by using a Josephson circuit (they can be configured on a chip of, for example, a few mm × 10 mm together with SQUID) and consume less power. Therefore, the third embodiment can be of smaller scale and lower power consumption than the first and second embodiments. In addition, the function of presetting counter 21 as used in the first and second embodiments is not required because superconducting inductance 82 retains the feedback quantity as it is unless a new pulse is written into it.

In the above embodiments, pulse signals output from SQUID flux sensors 1 associated with channels 1 to n are sequentially switched to be entered into single counter 21 for sequential measurement of the intensity of magnetic flux in each channel. Alternatively, modifications may be made such that a plurality of counters 21 are provided and channels are divided into as many groups as there are counters so as to make simultaneous measurement of magnetic flux in the groups.

According to the present invention, as described above, signals output from a plurality of SQUID flux sensors are entered into at least one or a plurality of processing circuits on a time series basis to measure magnetic flux. Accordingly, only one or a few processing circuits are needed for a large number of SQUID flux sensors and small magnetic fields in an object under examination such as a living body can be measured at substantially the same time and a circuit scale can be reduced to make a device small.

What is claimed is:

1. A multi-channel SQUID fluxmeter for detecting magnetic flux signals by use of an array of SQUID flux sensors, comprising;

a plurality of SQUID flux sensors capable of detecting small magnetic fields from different portions of an object under examination, each SQUID flux sensor having a digital SQUID for providing a pulse output signal; and processing circuit means for measuring each pulse output signal of each SQUID flux sensor during one interval of time division switching and for applying a corresponding feedback signal to a corresponding SQUID flux sensor during a corresponding one interval of time division switching so that each pulse output signal may become a predetermined value, intensities of magnetic flux being measured by said processing circuit means in terms of a magnitude of each feedback signal applied to each corresponding SQUID flux sensor.

2. A multi-channel SQUID fluxmeter according to claim 1, in which said processing circuit means includes a multiplexer as a means for switching the pulse output signals of said plurality of SQUID flux sensors to measure each pulse output signal during the one interval of time division switching.

3. A multi-channel SQUID fluxmeter according to claim 1, in which said processing circuit means includes a multiplexer for switching bias currents applied to one of said digital SQUIDs during a corresponding one interval of time division switching as a means for switching the pulse output signals of said plurality of SQUID flux sensors to measure each pulse output signal during the one interval of time division switching.

4. A multi-channel SQUID fluxmeter according to claim 1, in which said processing circuit means includes a multiplexer for selecting one corresponding SQUID flux sensor from among a plurality of SQUID flux sensors as a means for applying feedback signals to corresponding SQUID flux sensors.

5. A multi-channel SQUID fluxmeter according to claim 1, in which said processing circuit means includes a counter for counting said pulse output signals output from said SQUID flux sensors and a D/A converter for converting a count of said counter to an analog quantity which is used as a feedback signal.

6. The multi-channel SQUID fluxmeter according to claim 5, in which said counter comprises an up-down counter which counts up when a positive pulse signal is applied thereto and counts down when a negative pulse signal is applied thereto.

7. A multi-channel SQUID fluxmeter according to claim 5, further comprising a memory for storing a count value of said counter for each of said SQUID flux sensors.

8. The multi-channel SQUID fluxmeter according to claim 7, in which the process of measuring the pulse output signals from said plurality of SQUID flux sensors during intervals of time division switching is repeated for a plurality of cycles of the intervals and, when switching from a previous cycle to a present cycle, the count value of said counter which has been stored in said memory for one interval of the previous cycle is present in said counter for a corresponding one interval of the present cycle.

9. A multi-channel SQUID fluxmeter according to claim 1, in which the feedback signals are applied to said plurality of SQUID flux sensors so that pulse output signals from each of said SQUID flux sensors may become zero.

10. A multi-channel SQUID fluxmeter according to claim 1, in which magnetic flux generated according to the magnitude of a feedback signal are applied to said SQUID flux sensor in a direction that cancels out the magnetic flux entered into said digital SQUID of said SQUID flux sensor.

11. A multi-channel SQUID fluxmeter for detecting magnetic flux signals by use of an array of SQUID flux sensors, comprising:
a plurality of SQUID flux sensors capable of detecting small magnetic fields from different portions of an object under examination, each SQUID flux sensor having a digital SQUID for providing a pulse output signal, said SQUID flux sensors being divided into a plurality of groups; and
a plurality of processing circuit means corresponding in number to said groups for measuring each pulse output signal of each SQUID flux sensor during one interval of time division switching and for applying a corresponding feedback signal to a corresponding SQUID flux sensor during a corresponding one interval of time division switching so that each pulse output signal may reach a predetermined value, intensities of magnetic flux being measured by each of said processing circuit means in terms of a magnitude of each feedback signal applied to each corresponding SQUID flux sensor.

12. A multi-channel SQUID fluxmeter according to claim 11, in which said processing circuit means includes a multiplexer as a means for switching the pulse output signals of said plurality of SQUID flux sensors to measure each pulse output signal during the one interval of time division switching.

13. A multi-channel SQUID fluxmeter according to claim 11, in which said processing circuit means includes a multiplexer for switching bias currents applied to one of said digital SQUIDs during a corresponding one interval of time division switching as a means for switching the pulse output signals of said plurality of SQUID flux sensors to measure each pulse output signal during the one interval of time division switching.

14. A multi-channel SQUID fluxmeter according to claim 11, in which said processing circuit means includes a multiplexer for selecting one corresponding SQUID flux sensor from among a plurality of SQUID flux sensors as a means for applying feedback signals to corresponding SQUID flux sensors.

15. A multi-channel SQUID fluxmeter for detecting magnetic flux signals by use of an array of SQUID flux sensors, comprising:
a plurality of SQUID flux sensors capable of detecting small magnetic fields from different portions of an object under examination, each SQUID flux sensor having a digital SQUID for providing a pulse output signal; and
a counter for measuring each pulse output signal each flux sensor during one interval of time division switching and counting each measured pulse output signal during a corresponding one interval of time division switching; and
superconducting feedback circuit means provided for each SQUID flux sensor for storing magnetic flux quanta corresponding to a count value of said counter for each pulse output signal and for applying a feedback signal corresponding to said magnetic flux quanta to a corresponding SQUID flux sensor during a corresponding one interval of time division switching so that each pulse output signal from said corresponding SQUID flux sensor may become a predetermined value, intensities of magnetic flux being measured in terms of the count value of said counter.

16. A multi-channel SQUID fluxmeter according to claim 15, in which said superconducting feedback circuit means includes a superconducting inductance and a write gate for writing magnetic flux quanta into said superconducting inductance.

17. A multi-channel SQUID fluxmeter according to claim 15, in which said counter comprises:
a first multiplexer for switching bias currents applied to said digital SQUIDS of said plurality of SQUID flux sensors during a corresponding one internal of time division switching; and
a second multiplexer for outputting said pulse output signals from said SQUID flux sensors during a corresponding one interval of time division switching in synchronization with said first multiplexer.

* * * * *